United States Patent [19]

Johns

[11] Patent Number: 5,312,027
[45] Date of Patent: May 17, 1994

[54] PRECLEANING OF SOLDERED CIRCUIT CARDS TO PREVENT WHITE RESIDUE

[75] Inventor: James M. Johns, Anaheim, Calif.

[73] Assignee: Hughes Aircraft Company, Los Angeles, Calif.

[21] Appl. No.: 17,561

[22] Filed: Feb. 16, 1993

[51] Int. Cl.$^5$ .............................................. H05K 3/34
[52] U.S. Cl. .................................... 228/201; 228/202
[58] Field of Search ............... 228/201, 202, 223, 206; 148/23

[56] References Cited

U.S. PATENT DOCUMENTS

| | | | |
|---|---|---|---|
| 3,482,755 | 12/1969 | Raciti | 228/180.1 X |
| 3,588,998 | 6/1971 | Corsaro | 228/180.1 |
| 3,604,104 | 9/1971 | Glasgow | 228/202 X |
| 3,896,828 | 7/1975 | Foster et al. | 134/57 R |
| 3,997,459 | 12/1976 | Bogie et al. | 134/27 |
| 4,441,938 | 4/1984 | Poliak et al. | 148/23 |
| 5,141,568 | 8/1992 | Turner et al. | 228/223 X |

*Primary Examiner*—Kenneth J. Ramsey
*Attorney, Agent, or Firm*—Wanda K. Denson-Low

[57] ABSTRACT

Following soldering of electrical components on a circuit card in a soldering process that includes use of an aqueous-based flux, the circuit card, containing the soldered electrical components, is exposed to a dilute aqueous basic solution prior to a final hot water rinse. The dilute basic solution prevents the formation of a white residue commonly associated with the use of aqueous-based fluxes. For example, using a flux consisting essentially of an aqueous solution of citric acid, and rinsing in either an aqueous ammonia solution consisting essentially of about 20 to 250 ppm ammonium hydroxide or an aqueous solution of about 0.1 to 3 wt% sodium bicarbonate, prevents formation of the white residue.

15 Claims, No Drawings

PRECLEANING OF SOLDERED CIRCUIT CARDS TO PREVENT WHITE RESIDUE

BACKGROUND OF THE INVENTION

1. Field of the Invention

The present invention relates to soldering electrical components on circuit cards, and, more particularly, to a process for preventing a white residue, commonly associated with soldering using an aqueous-based flux, from forming.

2. Description of Related Art

In the soldering of electrical components on circuit cards using an aqueous-based flux, a "white residue" has been observed when rinsing the soldered circuit card to remove flux residues. While the white residue was believed in the past to be the result of using the aqueous fluxing agent, more recent indications are that the white residue is a result of residual products from the plating process used to form the conductive traces on the circuit card.

The white residue is objectionable, due not only to the appearance, but also because the composition is unknown, and this raises a concern that the residue may somehow be a corrosion product or be corrosive to the soldered joints. Attempts have been made over the years to get rid of the residue, all to no avail. For example, detergents and surfactants have variously been employed, typically in hot water solutions.

Thus, there is a need for a process that can be incorporated in a soldering/cleaning process employing an aqueous-based flux that would prevent the formation of such a white residue.

SUMMARY OF THE INVENTION

In accordance with the invention, following soldering, the circuit card, containing the soldered electrical components, is exposed to a dilute basic solution prior to a final water rinse. The dilute basic solution prevents the formation of the white residue.

DESCRIPTION OF THE PREFERRED EMBODIMENTS

When cleaning circuit cards after wave soldering with a water-soluble flux, the circuit cards are pre-rinsed in a dilute solution of a weak base, such as ammonium hydroxide ($NH_4OH$) or sodium bicarbonate ($NaHCO_3$) The circuit cards are then processed through the remainder of the conventional cleaning cycle, which includes exposure to a water, usually deionized, bath.

In one example, a dilute aqueous solution of ammonia, ranging from about 20 to 250 ppm, has been found to eliminate the white residue. Less than about 20 ppm of ammonia does not prevent the formation of the white residue. A concentration of greater than about 250 ppm of ammonia results in the onset of the characteristic ammonia odor, which is objectionable to human operators. A concentration of ammonia in water in the range of about 20 to 250 ppm is odorless, and hence desirable.

Ammonia is used in the form of ammonium hydroxide and is dissolved in water to the desired concentration. For example, 10 ml of 3% ammonia in 3 liters of water produces a concentration of 100 ppm ammonium hydroxide. Ammonia is the preferred base employed in the practice of the invention, because almost all ammonium salts are soluble in water.

The aqueous ammonia solution is preferably used at room temperature, since at higher temperatures, ammonium hydroxide tends to decompose, with the loss of ammonia. However, under a metering situation, such as described in greater detail below, the ammonia may be used at elevated temperatures.

In the case of sodium bicarbonate, the concentration in water ranges from about 0.1 to 3 wt %. Less than about 0.1 wt % does not prevent the formation of the white residue. Beyond about 3 wt % provides no additional benefit in the process of the invention.

In the practice of the present invention, the circuit card with electrical components mounted thereon is exposed to a water-base flux, such as an aqueous solution of citric acid, then the circuit card is exposed to solder, as by wave soldering, and allowed to cool. The soldered circuit card is then immersed in the dilute base, as described above, followed by a rinse in hot deionized water.

The use of the dilute base in conjunction with a flux comprising an aqueous solution of citric acid is especially efficacious. Citric acid solutions have been shown to provide an exceptional quality of solder, and the combination with the dilute base results in a soldered circuit card exhibiting a high quality of soldering and total lack of white residue.

The soldered circuit card may be immersed in a container containing the dilute base in the desired concentration. Alternatively, the circuit card may be immersed into a pre-wash section of an existing in-line aqueous cleaner, in which the water is cascaded from the final rinse to the pre-wash. In the latter case, the base may be automatically metered into the pre-wash section, employing a monitor, such as pH, to control the metering operation. The pH in such a case desirably ranges from about 7 to 11. It is preferable that the pre-rinse be cold or room temperature, as residues tend to form more quickly in warm or hot water. The pre-rinse water may then be drained to the sewer or to a recycling system for further treatment.

Thus, a process for preventing the formation of residues on a soldered circuit card has been disclosed. It will be appreciated by those skilled in the art that various modifications and changes of an obvious nature may be made without departing from the scope of the invention, and all such modifications and changes are intended to fall within the scope of the invention, as defined by the appended claims.

What is claimed is:

1. A process for preventing formation of a white residue following soldering electrical components on a circuit card employing an aqueous-based flux, wherein the soldered circuit card is exposed to a dilute aqueous basic solution prior to a final water rinse.

2. The process of claim 1 wherein said aqueous-based flux consists essentially of an aqueous solution of citric acid.

3. The process of claim 1 wherein said aqueous basic solution comprises a base selected from the group consisting of ammonia and sodium bicarbonate.

4. The process of claim 3 wherein said aqueous basic solution consists essentially of about 20 to 250 ppm of ammonium hydroxide in water.

5. The process of claim 4 wherein said aqueous solution of ammonium hydroxide in water is maintained at room temperature.

6. The process of claim 4 wherein said aqueous solution of ammonium hydroxide is metered into a continuous water rinse in an amount so as to maintain said rinse at a pH of about 7 to 11.

7. The process of claim 3 wherein said aqueous basic solution consists essentially of about 0.1 to 3 wt % of sodium bicarbonate in water.

8. A process for preventing formation of a white residue following soldering electrical components on a circuit card employing an aqueous-based flux, wherein the soldered circuit card is exposed to a dilute aqueous basic solution consisting essentially of ammonia prior to a final hot water rinse.

9. The process of claim 8 wherein said aqueous-based flux consists essentially of an aqueous solution of citric acid.

10. The process of claim 8 wherein said aqueous basic solution consists essentially of about 20 to 250 ppm of ammonium hydroxide in water.

11. The process of claim 10 wherein said aqueous solution of ammonium hydroxide in water is maintained at room temperature.

12. The process of claim 10 wherein said aqueous solution of ammonium hydroxide is metered into a continuous water rinse in an amount so as to maintain said rinse at a pH of about 7 to 11.

13. A process for preventing formation of a white residue following soldering electrical components on a circuit card employing an aqueous-based flux, wherein the soldered circuit card is exposed to a dilute aqueous basic solution consisting essentially of sodium bicarbonate prior to a final hot water rinse.

14. The process of claim 13 wherein said aqueous-based flux consists essentially of an aqueous solution of citric acid.

15. The process of claim 13 wherein said aqueous basic solution consists essentially of about 0.1 to 3 wt % of sodium bicarbonate in water.

* * * * *